United States Patent [19]
Feese

[11] Patent Number: 6,026,008
[45] Date of Patent: Feb. 15, 2000

[54] ELECTRONIC MEMORY DEVICE, IN PARTICULAR FOR USE IN IMPLANTABLE MEDICAL APPLIANCES

[75] Inventor: Ulrich Feese, Berlin, Germany

[73] Assignee: Biotronik Mess- und Therapiegerate GmbH & Co., Berlin, Germany

[21] Appl. No.: 09/089,449

[22] Filed: Jun. 3, 1998

[30] Foreign Application Priority Data

Jun. 7, 1997 [DE] Germany .......................... 197 24 053

[51] Int. Cl.[7] .................................................. G11C 5/06
[52] U.S. Cl. ............................... 365/63; 365/51; 365/52; 257/690
[58] Field of Search .................. 365/51, 52, 63; 361/760, 761; 257/690, 691

[56] References Cited

U.S. PATENT DOCUMENTS

| | | | |
|---|---|---|---|
| 4,223,678 | 9/1980 | Langer et al. | 128/419 |
| 5,229,960 | 7/1993 | Givry | 365/63 |
| 5,430,859 | 7/1995 | Norman et al. | 365/52 |
| 5,572,457 | 11/1996 | Michael | 365/52 |
| 5,680,342 | 10/1997 | Frankeny | 365/52 |
| 5,745,426 | 4/1998 | Sekiyama | 365/226 |

FOREIGN PATENT DOCUMENTS

| | | |
|---|---|---|
| 0 501 474 | 9/1992 | European Pat. Off. . |
| 0 614 190 | 9/1994 | European Pat. Off. . |
| 0 702 980 | 3/1996 | European Pat. Off. . |
| 42 32 268 | 3/1994 | Germany . |
| 195 17 367 | 11/1995 | Germany . |
| 2 026 870 | 2/1980 | United Kingdom . |

*Primary Examiner*—Son Mai
*Attorney, Agent, or Firm*—Browdy and Neimark

[57] ABSTRACT

An electronic memory device, in particular for use in implantable medical appliances, is provided with one or more electronic read/write memory chips, a carrier for the mechanical fixing of the RAM chip or chips, address inputs, a read/write input and a data bus connection, the RAM chip or chips in the memory device each being provided with two interfaces which are arranged on the input side and output side relative to the respective RAM chip and each comprise address bus, data bus and read/write connection, the address bus, data bus and read/write connection of the input-side interface being connected internally directly to the respectively allocated address bus, data bus and read/write connection of the output-side interface for signal transmission by the RAM chip.

7 Claims, 1 Drawing Sheet

ELECTRONIC MEMORY DEVICE, IN PARTICULAR FOR USE IN IMPLANTABLE MEDICAL APPLIANCES

BACKGROUND OF THE INVENTION

1. Field of the Invention

The invention relates to an electronic memory device, in particular for use in implantable medical appliances.

2. Background Art

Integrated memory devices of this type with one or more electronic read/write memory chips—usually described as RAM (=Random Access Memory)—are basically known in the state of the art and are widely used. For example, these memory devices are used as main memory in personal computers, integrated computer systems, etc.

One or more of these RAM chips are normally held on a board provided with printed conductors. The board is the carrier, in other words is used for the mechanical fixing and bonding of the connections of the RAM chips. The RAM chip itself usually has an activating/deactivating input, a read/write input, a data bus connection and a plurality of address inputs. Further details are not required as they belong to general specialist knowledge.

The present invention relates, in particular, to the field of implantable cardiac pacemakers in which it is already known to use RAM chips. For example, GB-A-20 26 870 describes a microprocessor-controlled cardiac pacemaker in which a RAM chip stores individual stimulation parameters or entire stimulation programs. U.S. Pat. No. 4,223,678 discloses RAM chips as memories for digitalized ECG sequences and specific cardiological events.

With regard to the background of the invention it should be mentioned that, in medical implants such as cardiac pacemakers, the ceramic plates used as substrates which carry RAM chips guarantee high continuous stability and reliability and allow a high packing density in the component set.

The electrical connection between the housing-free components and the conductors of the substrate is produced via so-called bonding connections for which bonding surfaces, so-called bonding pads, are provided on the substrate. An electrical connection between an electrical conductor on the one hand and a connecting leg of an electronic component on the other hand is produced via such bonding pads. This is described as a so-called "die-to-substrate bond".

Alternatively, electronic components and chips can be connected to one another directly via bonding pads and electric lines on the component side. This is described as a so-called "die-to-die bond".

The number of components which can be placed on a common substrate is basically restricted by the surface area of the substrate. The complexity of the conductors, which increases with the number of components, is restricted by the surface area of the substrate as the conductors can be guided only in two dimensions, i.e. without intersections, on the substrate surface. Substrates in which conductors are guided in several mutually separated planes allow complicated remedial action in this respect. The number of components is also restricted by the number of their connecting legs as the necessary bonding pads have to have room on the substrate surface for this purpose.

Starting from this background the following specific drawbacks of the state of the art are to be removed for the field of application of the invention, namely use in implantable medical appliances.

Therefore, when using conventional RAM chips which are generally optimized, in particular with respect to memory capacity and memory access times, in implants, the lack of flexibility in adaptation of the memory capacity and therefore also of the overall volume and the power consumption are drawbacks. On the one hand, along with the design of the contact faces and the electrical connections on the substrate, the size of the attachable RAM chip is also determined inalterably for a specific substrate and, on the other hand, a RAM chip which is adapted with respect to its memory capacity has to be developed specifically for a certain application in each case. Therefore, depending on the number of different applications, a similar number of different RAM chips also has to be developed even though it would be more economical to produce greater numbers of a single memory chip which can be used for various memory requirements.

Furthermore, the connection between RAM chip and the respective substrate, which is normal in the state of the art, is also detrimental because, when using a plurality of RAM chips, a plurality of contact faces which demand a relatively large area is required on the substrate for each individual chip. Furthermore, further components have to be arranged on the substrate for activation/deactivation of the individual chips (address decoders).

Furthermore, when using a plurality of RAM chips, the RAM chips are usually connected indirectly via the substrate so a high number of contacts has to be produced on the substrate. In addition, losses of energy are caused during the transmission of signals into the conductors printed on the substrate owing to the dielectric properties thereof.

A further drawback is that the lithium batteries with a voltage of 2.8 V used in implants do not generally attain the necessary operating voltages for conventional RAM chips.

SUMMARY OF THE INVENTION

Starting from the aforementioned problems of the state of the art, the object of the invention is to provide an electronic memory device, in particular for use in implantable medical appliances, which can be produced compactly and is very flexible in design with respect to its memory capacity.

This object is achieved by an architecture of the memory device according to which the RAM chip or chips are each basically provided with two interfaces arranged on the input side and the output side. Address bus, data bus and read/write connection of these interfaces are each connected to one another internally for signal transmission through the RAM chip. The conditions for coupling several RAM chips to one another in succession by direct electrical connections—that is without passing via the substrate—are therefore fulfilled. It is pointed out in connection with the data bus that the input-side interface also acts as a signal output and the output-side interface as a signal input, depending on the direction of data flow.

A further advantage of the direct connection and interlinking of chips permitted by the architecture according to the invention when using several chips resides in the saving of a plurality of contact faces and conductors otherwise required on the substrate, so the substrate area can be utilized better and the complexity and packing density can therefore be increased for other components. Losses of energy during signal transmission are also avoided owing to the lack of damping through the dielectric material with the direct line connection. In this respect, memory devices with a higher capacity can be produced than with conventional RAM chips at the predetermined supply voltage of the lithium batteries normally used.

The memory device according to the invention may require at most one single chip-substrate connecting line in each case for each address and data bus connection and the read/write input, even when several RAM chips are provided.

All other connections when using a plurality of RAM chips can be connected via a cascade-like coupling of these chips via direct chip connecting lines ("die-to-die bonds").

According to preferred embodiments of the invention an address expansion arrangement is provided on the RAM chips of the device, by means of which a binary input value is input as address input signal and is compared with a predetermined set value. If input value and set value coincide, the respective RAM chip is activated. The binary input value is also converted in the address logic of the address expansion arrangement according to a predetermined algorithm into a binary output value and is transmitted via an output connection to the address expansion arrangement of the following RAM chip as input value. This structure results in a hierarchical order by means of which a specific chip from a number of RAM chips connected in series can be addressed without separate address decoders being required on the carrier. The address logic circuit advantageously contains a binary decremental counter. Further details will emerge from the description of the embodiment of the invention.

Furtheron a modular arrangement of RAM chips is provided on a carrier which is free from contact faces. It is therefore possible to produce the memory device on a component or housing face of an appliance independently of the surface area of the substrate which is very limited, in particular in the case of implantable appliances. On the substrate carrying the other electronic components of the appliance, it is merely necessary to provide an appropriate number of contact faces for attachment of the lines originating from the memory arrangement disposed in a different way.

Therefore, RAM chips can advantageously be bonded to otherwise unutilized internal surfaces of the housing of an implantable appliance or on a substrate covering. The memory capacity can therefore be increased at a later stage in an appliance completely independently of the predetermined spatial conditions on the surface of the substrate.

This preferred embodiment of the invention therefore helps considerably to reduce the requirements in terms of area owing to the main memory device on the substrate.

According to a further preferred embodiment, the RAM chips in the memory device can also be stacked congruently. RAM chips intended for such an arrangement have a different geometric input and output configuration like RAM chips which can be lined up in a planar manner in the memory device. Memory devices according to the invention with stacked RAM chips are also particularly suitable for the object forming the basis of the invention. Conventional RAM chips do not allow this configuration as, in a congruent position, the higher respective chip would conceal the connecting faces of the one beneath it.

Further features, details and advantages of the invention will emerge from the following description in which an embodiment of the subject of the invention is described in more detail with reference to the accompanying drawings.

DESCRIPTION OF THE PREFERRED EMBODIMENT

Figure 1:
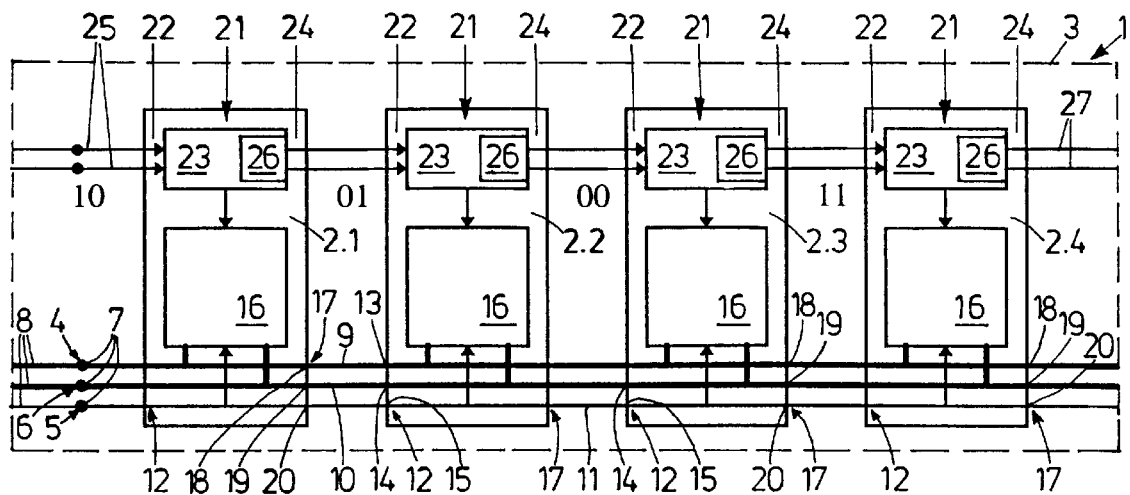
FIG. 1 is a block circuit diagram of an electronic memory device.

In FIG. 1, the entire electronic memory device is provided with the reference numeral 1. This memory device comprises four RAM chips 2.1, 2.2, 2.3 and 2.4 which are fastened merely mechanically on a carrier 3 of which the contour is shown in a broken line. The memory device 1 comprises address inputs 4, a read/write input 5 and a data bus connection 6 which can be formed, for example, by contact faces 7 on the carrier 3. Conventional conductors 8 lead to the contact faces 7.

The address bus 9 of the memory device 1 which comprises, for example, five address lines, is connected to its address input 4. The RAM chips 2.1 to 2.4 therefore have a memory capacity of $2^5$, i.e. 32 bits.

The data bus 10 of the memory device with a number of lines depending on the word width of the information to be stored is attached to the data bus connection 6 through which data is read both in and out. An individual read/write line 11 is also provided.

Each of the RAM chips 2.1 to 2.4 has an input-side interface 12 formed by an address bus connection 13, a data bus connection 14 and a read/write connection 15. These connections 13 to 15 are connected in the conventional manner to the actual memory unit 16 internally in the RAM chip 2.1 to 2.4. At the same time, these input-side connections 13 to 15 are connected to corresponding connections of an output-side interface 17 internally on the RAM chips 2.1 to 2.4. These connections are, in turn, an address bus connection 18, a data bus connection 19 and a read/write connection 20.

The internal connection between the address bus 18, data bus 19 and read/write connections 20 of the input-side interface 12 and output-side interface 17 is generally created not directly—i.e. galvanically—, but normally via signal amplifiers in the line paths. These signal amplifiers only operate in one direction in each case so the direction in which the data bus lines are being operated is switched over via the read/write signal.

Direct connecting lines designed according to the "die-to-die bond" technique lead from the aforementioned connections 18 to 20 to the corresponding connections 13 to 15 of the next RAM chip 2.2 to 2.4. On the basis of this architecture, all signals are simultaneously present at the address input 4, read/write input 5 and data bus connection 6 of the memory device 1 at the corresponding inputs of all RAM chips 2.1 to 2.4.

To allow activation of a single RAM chip, each RAM chip 2.1 to 2.4 is provided with an address expansion arrangement 21 consisting of an input connection 22, an address logic 23 and an output connection 24. Two expanded address lines 25 are provided.

The address logic 23 in each RAM chip 2.1 to 2.4 has the following mode of operation:

An address input signal—i.e. a binary input value—is input via the input connection 22, for example the binary number "1 0" with the RAM chip 2.1 in FIG. 1. The RAM chips 2.1 to 2.4 are activated when this binary input value corresponds to a set value, for example "00". The address logic 23 in the RAM chip 2.1 carries out this comparison and does not activate the chip 2.1. A decremental counter 26 which converts the input value according to a specific instruction, in other words decrements by "1" in the present case, is also integrated in the address logic 23. If binary "1" is deducted from the prevailing input value U "1 0" at the RAM chip 2.1, the binary value "01" is produced and is present at the output connection 24. This converted value is transmitted via corresponding connecting lines 27 by the "die-to-die bond" technique to the address logic 23 of the second RAM chip 2.2. As the input value "1 0" does not correspond to the set value "00" here either, the RAM chip 2.2 also remains inactive. The input value "01" is in turn decremented by binary "1", therefore becomes "00". This value is transmitted via the output connection 24 of the chip 2.2 to the chip 2.3. Its address logic recognizes that the input value corresponds to the set value "00" and therefore activates the chip 2.3. Decrementation of binary "1" from "00" produces "11", which binary signal is transmitted from the output connection 24 of the chip 2.3 to the last chip 2.4. As this value does not correspond to the set value "00", chip 2.4 also remains inactive.

To sum up, four RAM chips can be addressed individually by the above-described address expansion arrangement 24.

Staring now from a memory device 1 which, unlike that in FIG. 1, merely comprises a single RAM memory 2.1, the memory capacity can be doubled by attachment and direct electrical connection of a second RAM chip 2.2. It is not necessary to change the wiring on a substrate. Instead, a further identical RAM chip is attached to the output side of an existing RAM chip. In this way, therefore, with uniform design of the substrate and in the presence of, for example, two expanded address inputs in the context of the described address expansion, the memory capacity can be increased by a factor of $2^2=4$. This can also be carried out without difficulty at a later stage with different requirements of the memory capacity of the memory device.

Figure 2:
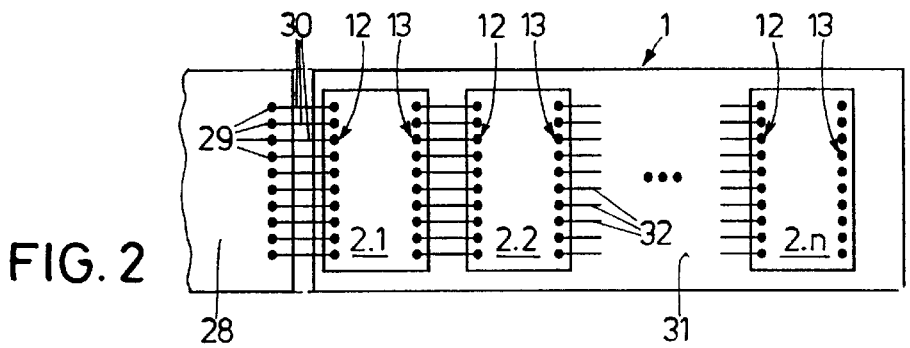
FIGS. 2 and 3 are a schematic plan view and side view of a memory device of modular construction.
Figure 3:
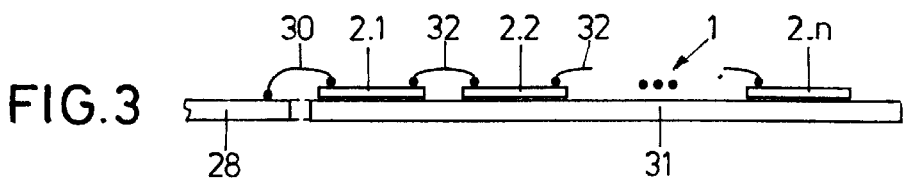

In FIGS. 2 and 3, a modular arrangement of RAM chips 2 is possible independently of the surface area of the substrate 24 which is very restricted in the case of implants. On the substrate 28 it is merely necessary to provide the corresponding number of contact faces 29 which are connected via corresponding "die-to-substrate" connections 30 to the first RAM chip 2.1. This is bonded with the following RAM chips 2.2 to 2.n, for example to a partition wall 31, shown schematically in FIGS. 2 and 3, of an implantable appliance. Between the RAM chips 2, respective "die-to-die" connecting lines 32 are provided between the input-side and output-side interfaces 12, 17.

What is claimed is:

1. An electronic memory device, in particular for use in implantable medical appliances comprising one at least electronic read/write memory chip (RAM chips) (2), a carrier (3) for mechanical fixing of the at least one RAM chip (2), address inputs (4), a read/write input (5), and a data bus connection (6), wherein the at least one RAM chip (2) in the memory device is provided with two interfaces (12,17) arranged on an input side and output side relative to the respective RAM chip (2) and each comprises address bus, data bus and read/write connection (14,15,16,18,19,20), the address bus, data bus and read/write connection (14,15, 16) of the input side interface (12) being connected internally to a respectively allocated address bus, data bus and read/write connection (18,19,20) of the output side interface (17) for signal transmission through the RAM chip (2);

wherein each RAM chip (2) is provided with an address expansion arrangement (21) with input connection (22), address logic (23) and output connection (24) in which in each case a binary input value is input via the input connection (22) and on the one hand is compared by an address logic (23) with a set value for activation of the RAM chip (2) and, on the other hand, the binary input value is converted according to a predetermined algorithm into a binary output value which is present at an output connection (24) for transmission as input value to an address expansion arrangement (21) of a following RAM chip (2).

2. A memory device according to claim 1, wherein, when a plurality of RAM chips (2.1, 2.2, 2.3, 2.4) is arranged in a memory device (1), the input-side interface (12) of the first RAM chip (2.1) is coupled to associated address and read/write inputs (4, 5) and the data bus connection (6) of the memory device (1) via a chip-substrate connecting line (30).

3. A memory device according to claim 2, wherein the input-side interfaces (12) of the second and further RAM chips (2.1, 2.2, 2.3, 2.4) are coupled to the output-side interfaces (17) of a respective preceding RAM chip (2.1, 2.2, 2.3, 2.4) in the manner of a cascade via direct chip-chip connecting lines (32).

4. A memory device according to claim 1, wherein the address logic (23) comprises a binary decremental counter (26) for converting the input value.

5. A memory device according to claim 1, wherein the RAM chips (2) are arranged in modular fashion on a carrier (31) which is preferably free from connecting faces.

6. A memory device according to claim 5, comprising one of a component or housing area (31) of the appliance accommodating the memory arrangement (1) as carrier for the RAM chips (2.1, 2.2, 2.3, 2.4).

7. A memory device according to claim 1, wherein a plurality of RAM chips (2) is stacked congruently in the memory device.

\* \* \* \* \*

UNITED STATES PATENT AND TRADEMARK OFFICE
CERTIFICATE OF CORRECTION

PATENT NO. : 6,026,008
DATED : December 15, 1996
INVENTOR(S) : Ulrich Feese

It is certified that error appears in the above-identified patent and that said Letters Patent is hereby corrected as shown below:

Title page, line [73], under Assignee, insert after "Co.", --Ingenieurbüro Berlin--.

Signed and Sealed this

Second Day of January, 2001

Attest:

Attesting Officer

Q. TODD DICKINSON
Commissioner of Patents and Trademarks

UNITED STATES PATENT AND TRADEMARK OFFICE
CERTIFICATE OF CORRECTION

PATENT NO. : 6,026,008
DATED : February 15, 2000
INVENTOR(S) : Ulrich Feese

Page 1 of 1

It is certified that error appears in the above-identified patent and that said Letters Patent is hereby corrected as shown below:

Title page,
Item [73], under Assignee, insert after "Co.", -- Ingenieürburo Berlin --.

Signed and Sealed this

Second Day of October, 2001

Attest:

*Attesting Officer*

NICHOLAS P. GODICI
*Acting Director of the United States Patent and Trademark Office*